(12) United States Patent
Huang et al.

(10) Patent No.: US 8,183,092 B2
(45) Date of Patent: May 22, 2012

(54) METHOD OF FABRICATING STACKED SEMICONDUCTOR STRUCTURE

(75) Inventors: Chien-Ping Huang, Taichung (TW);
Chih-Ming Huang, Taichung (TW);
Han-Ping Pu, Taichung (TW); Yu-Po Wang, Taichung (TW); Cheng-Hsu Hsiao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 4 days.

(21) Appl. No.: 12/829,704

(22) Filed: Jul. 2, 2010

(65) Prior Publication Data

US 2010/0267202 A1 Oct. 21, 2010

Related U.S. Application Data

(62) Division of application No. 11/591,974, filed on Nov. 1, 2006, now Pat. No. 7,772,685.

(30) Foreign Application Priority Data

Feb. 3, 2006 (TW) .............................. 95103695 A (51) Int. Cl.
*H01L 21/00* (2006.01)
*H01L 21/46* (2006.01)
(52) U.S. Cl. ........ 438/113; 438/118; 438/125; 438/126; 438/127; 438/456; 257/E21.502; 257/E21.504
(58) Field of Classification Search .................. 438/108, 438/113, 118, 127, 455, 456; 257/E21.504
See application file for complete search history.

(56) References Cited

U.S. PATENT DOCUMENTS

| | | | |
|---|---|---|---|
| 5,222,014 A | 6/1993 | Lin | |
| 5,450,283 A * | 9/1995 | Lin et al. | 361/704 |
| 6,596,565 B1 * | 7/2003 | Hembree | 438/122 |
| 6,787,916 B2 | 9/2004 | Halahan | |
| 6,828,664 B2 | 12/2004 | Hung et al. | |
| 6,861,288 B2 | 3/2005 | Shim et al. | |
| 6,919,631 B1 | 7/2005 | Hoffman et al. | |
| 7,161,249 B2 | 1/2007 | Shim et al. | |
| 7,679,178 B2 | 3/2010 | Pu et al. | |
| 2004/0099917 A1 * | 5/2004 | Greathouse et al. | 257/414 |
| 2005/0133932 A1 * | 6/2005 | Pohl et al. | 257/777 |
| 2005/0266592 A1 * | 12/2005 | Hawthorne | 438/27 |
| 2007/0166884 A1 * | 7/2007 | Li et al. | 438/113 |

* cited by examiner

*Primary Examiner* — Kevin Parendo
(74) *Attorney, Agent, or Firm* — Peter F. Corless; Steven M. Jensen; Edward Wildman Palmer LLP (57) ABSTRACT

A stacked semiconductor structure and fabrication method thereof are provided. The method includes mounting and connecting electrically a semiconductor chip to a first substrate, mounting on the first substrate a plurality of supporting members corresponding in position to a periphery of the semiconductor chip, mounting a second substrate having a first surface partially covered with a tape and a second surface opposite to the first surface on the supporting members via the second surface, connecting electrically the first and second substrates by bonding wires, forming on the first substrate an encapsulant for encapsulating the semiconductor chip, the supporting members, the second substrate, the bonding wires, and the tape with an exposed top surface, and removing the tape to expose the first surface of the second substrate and allow an electronic component to be mounted thereon. The present invention prevents reflow-induced contamination, spares a special mold, and eliminates flash.

14 Claims, 11 Drawing Sheets

METHOD OF FABRICATING STACKED SEMICONDUCTOR STRUCTURE

CROSS-REFERENCE TO RELATED APPLICATION(S)

This application is a divisional of copending application U.S. Ser. No. 11/591,974, filed on Nov. 1, 2006.

BACKGROUND OF THE INVENTION

1. Field of the Invention

The present invention relates generally to a semiconductor device and fabrication method thereof, and more particularly, to a stacked semiconductor structure and fabrication method thereof.

2. Description of Related Art

Given the trend toward multifunction, higher electrical performance and high-speed operation, more and more semiconductor devices integrated with a plurality of chips or packages are released.

Figure 1:
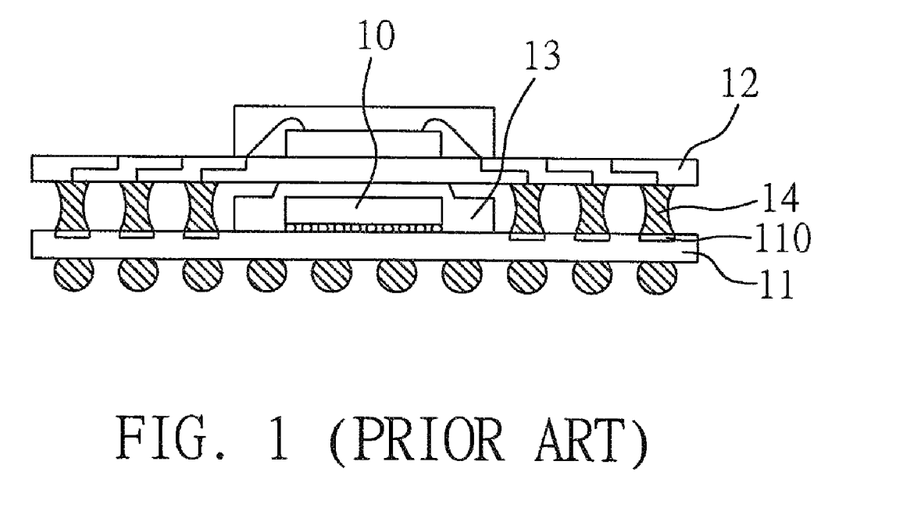
FIG. 1 is a cross-sectional view of a stacked semiconductor package structure as disclosed in U.S. Pat. No. 5,222,014.

With reference to FIG. 1, U.S. Pat. No. 5,222,014 proposes a stacked semiconductor package structure, which includes a first ball grid array (BGA) substrate 11 having pads 110 provided on an upper surface thereof, a semiconductor chip 10 mounted on the first BGA substrate 11, an encapsulant 13 encapsulating the semiconductor chip 10, and a second packaged BGA substrate 12 mounted and electrically connected to the pads 110 of the first BGA substrate 11 through solder balls 14.

However, in the above stacked semiconductor package structure, the number of the pads 110 for electrically connecting the second BGA substrate 12 and the first BGA substrate 11, types of packages to be stacked, and installation of electrical inputs/outputs (I/O) are subject to the size of the encapsulant 13. In other words, the types of the stacked packages and the number of the electrical I/O must be selected according to layout of the pads 110. Moreover, height of the encapsulant 13 provided on the first BGA substrate 11 should be minimized (generally limited to below 0.3 mm) to meet the limitation of height of the solder balls 14 during the stacking process, thereby increasing the difficulty of the process.

Figure 2:
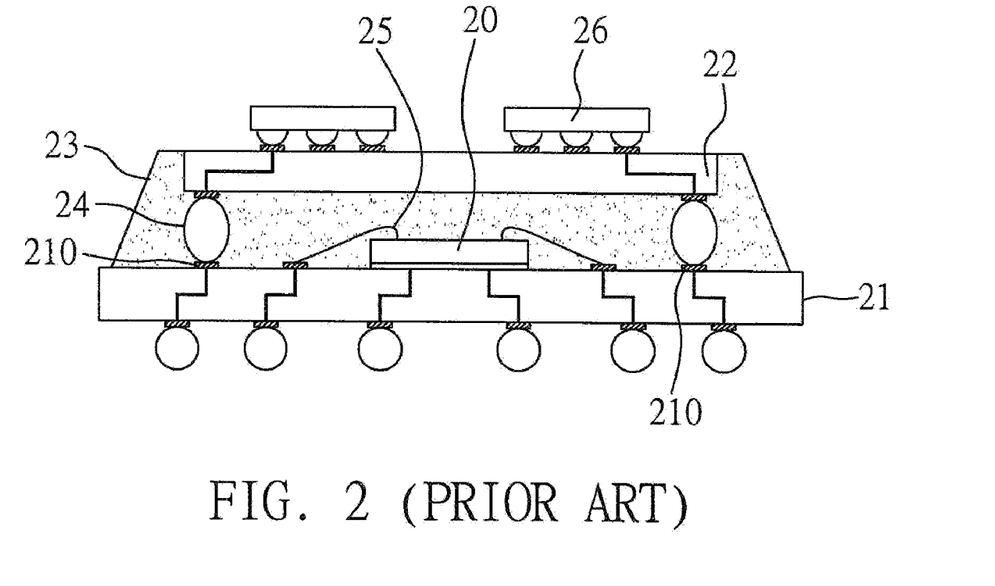
FIG. 2 is a cross-sectional view of a stacked semiconductor package structure as disclosed in U.S. Pat. No. 6,828,664.

With reference to FIG. 2, U.S. Pat. No. 6,828,664 proposes another stacked semiconductor package structure, which includes a first BGA substrate 21 having pads 210 provided on an upper surface thereof, a semiconductor chip 20 mounted on the first BGA substrate 21 and electrically connected to the first BGA substrate 21 through bonding wires 25, a second BGA substrate 22 mounted and electrically connected to the pads 210 through solder balls 24, and an encapsulant 23 for encapsulating the semiconductor chip 20, the bonding wires 25 and the second BGA substrate 22. Therein, the top surface of the second BGA substrate 22 is exposed from the encapsulant 23 such that packages 26 can be mounted on the second BGA substrate 22.

However, to form the above stacked semiconductor package structure, a reflow process is performed to electrically connect the second BGA substrate 22 to the first BGA substrate 21 through solder balls 24 after the semiconductor chip 20 is electrically connected to the first BGA substrate 21 through bonding wires 25, which not only adversely affects quality of the bonding wires 25, but also brings about contamination of the semiconductor chip 20 and the first BGA substrate 21, thereby reducing product yield and product reliability.

Figure 3A:
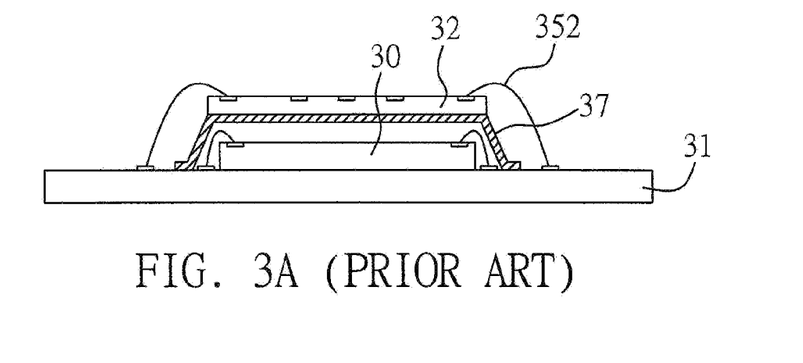
FIGS. 3A through 3C are cross-sectional views of a method for fabricating a stacked package semiconductor as disclosed in U.S. Pat. No. 6,861,288.
Figure 3B:
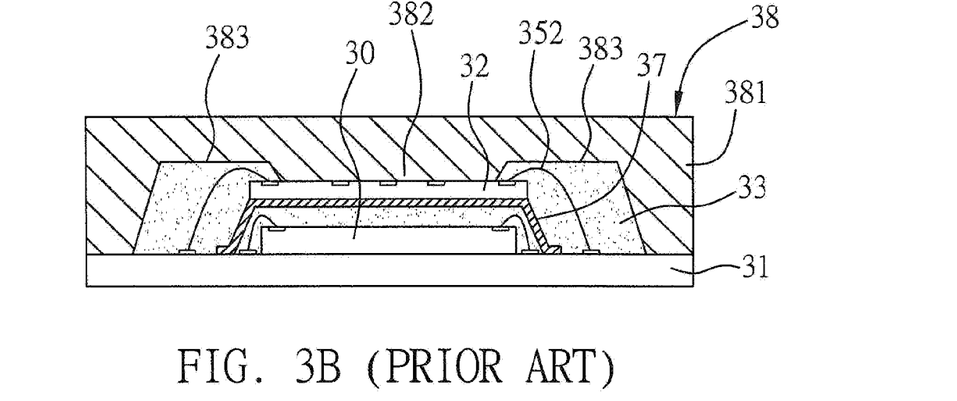
Figure 3C:
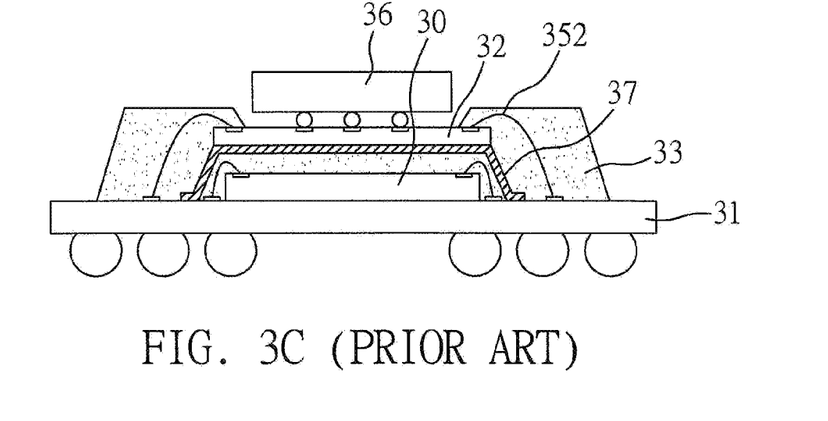

To overcome the above defects, U.S. Pat. No. 6,861,288 proposes a method for fabricating a stacked package semiconductor without performing a reflow process, and the method is illustrated with FIGS. 3A through 3C. First, a semiconductor chip 30 is mounted on a substrate 31, and a metallic stiffener 37 is disposed on the substrate 31 with the semiconductor chip 30 received below the metallic stiffener 37. A stacked substrate 32 is mounted on the metallic stiffener 37, and electrically connected to the substrate 31 through bonding wires 352 (as shown in FIG. 3A). Then, a special mold 38 having an upper mold 381 is disposed on the substrate 31. Therein, the upper mold 381 includes a receiving space 383 and a protruding portion 382 surrounded by the receiving space 383. The receiving space 383 receives the semiconductor chip 30, the stiffener 37, the stacked substrate 32, and the bonding wires 352. The protruding portion 382 extends from an inner top surface of the upper mold 381 and abuts against the top surface of the stacked substrate 32. Thereafter, a molding process is performed to form an encapsulant 33 for encapsulating the semiconductor chip 30, the bonding wires 352 and the stacked substrate 32, as shown in FIG. 3B. Finally, the mold 38 is removed, and a package 36 is mounted on the top surface of the stacked substrate 32 exposed out of the encapsulant 33, as shown in FIG. 3C.

However, the process cost increases because of the introduction of the metallic stiffener 37 into the above-described method. Furthermore, the process cost increases also because the process involves using a special mold to prevent the bonding wires 352 on the substrate 32 from touching the mold.

In addition, during the molding process disclosed in U.S. Pat. Nos. 6,828,664 and 6,861,288, an encapsulant is likely to flash over and contaminate the second BGA substrate or the stacked substrate, thereby bringing trouble to subsequent processes such as a deflash process, a package stacking process and an electrical connection process.

Accordingly, there exists a strong need in the art for a stacked semiconductor structure and fabrication method thereof which can overcome the above defects.

SUMMARY OF THE INVENTION

Accordingly, it is a primary objective of the present invention to provide a stacked semiconductor structure and a fabrication method thereof without limiting the size and type of stacked packages and the number of electrical I/O.

It is another objective of the present invention to provide a stacked semiconductor device and a fabrication method thereof, which avoids the use of a reflow process for electrical connection between stacked substrates and thus prevents the contamination of a semiconductor chip.

It is yet another objective of the present invention to provide a stacked semiconductor structure and a fabrication method thereof, which prevents a fabrication cost increase problem due to a special mold used.

It is a further objective of the present invention to provide a stacked semiconductor structure and a fabrication method thereof, which prevents a stacked substrate from flash-related contamination during a molding process. In order to attain the above and other objectives, a method of fabricating a stacked semiconductor structure is provided according to the present invention. The method includes the steps of: mounting and electrically connecting at least one semiconductor chip to a first substrate, gluing to the first substrate a plurality of supporting members corresponding in position to a periphery of the semiconductor chip; mounting a second substrate having a first surface and a second surface opposite to the first surface to the supporting members via the second surface, the first surface being partially covered by a tape; connecting electrically the first and second substrates through bonding wires;

and performing a molding process to form on the first substrate an encapsulant for encapsulating the semiconductor chip, the supporting members, the second substrate, the bonding wires and the tape, exposing a top surface of the tape from the encapsulant. Then, the tape is removed so as to expose part of the first surface of the second substrate out of the encapsulant, and an electronic component is mounted and electrically connected to the exposed first surface of the second substrate. The semiconductor chip is electrically connected to the first substrate by wire bonding or in a flip-chip manner. The stacked semiconductor structure according to the present invention is fabricated by one-off production or batch production as appropriate.

A stacked semiconductor structure is further provided according to the present invention. The structure includes a first substrate; at least one semiconductor chip mounted and electrically connected to the first substrate; a plurality of supporting members glued to the first substrate and corresponding in position to a periphery of the semiconductor chip; a second substrate having a first surface and a second surface, wherein the second substrate is mounted to the supporting members via a periphery of the second surface; bonding wires for electrically connecting the first and second substrates; and an encapsulant formed on the first substrate to encapsulate the semiconductor chip, the bonding wires, the supporting members and the second substrate, wherein the first surface of the second substrate is exposed from the encapsulant. In addition, the stacked semiconductor structure further includes at least one electronic component attached to the first surface of the second substrate.

Furthermore, in other embodiments of the stacked semiconductor structure and fabrication method thereof according to the present invention, the method can also include attaching and electrically connecting at least one semiconductor chip, a passive component or a package to the second surface of the second substrate before mounting the second substrate, via the second surface of the second substrate, on the supporting members disposed on the first substrate, so as to enhance electrical functions of the stacked semiconductor structure. Moreover, each of the supporting members can be a scrap chip, a metal block, an insulating block, a substrate piece or the like. Therein, if the substrate pieces are used as the supporting members, by electrically connecting the supporting members to the second substrate and the first substrate respectively, the supporting members can function as an electrical bridge between the first and second substrates, thereby shortening the length of the bonding wires required for direct electrical connection between the second substrate and the first substrate.

Thus, according to the stacked semiconductor structure and fabrication method thereof of the present invention, since the solder pads on the first surface of the second substrate are completely exposed from the encapsulant, conventional limitation on the size and type of stacked packages and the number of electrical I/O is eliminated. Moreover, by electrically connecting the second substrate and the first substrate through a wire bonding process instead of a reflow process, the known contamination problem with a semiconductor chip is overcome. Further, by disposing the tape on the second substrate before performing a molding process, the present invention avoids the use of the special mold of the prior art, thereby decreasing the fabrication cost and preventing the flash-induced contamination problem of the second substrate.

DETAILED DESCRIPTION OF PREFERRED EMBODIMENTS

The following specific embodiments are provided to illustrate the disclosure of the present invention, these and other advantages and effects can be apparent to those skilled in the art after reading the disclosure of this specification.

First Embodiment

With reference to FIGS. 4A through 4G, shown are cross-sectional views of a method of fabricating a stacked semiconductor structure.

Figure 4A:
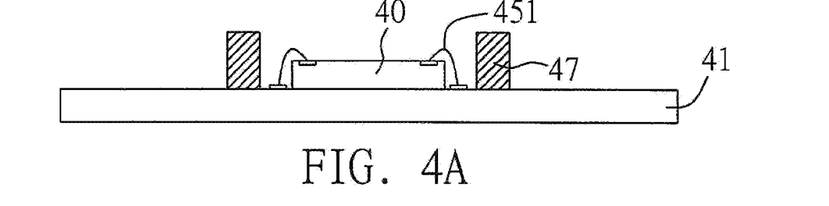
FIGS. 4A through 4G are cross-sectional views showing a stacked semiconductor structure and fabrication method thereof according to a first embodiment of the present invention.

As shown in FIG. 4A, a first substrate 41 such as a BGA (Ball Grid Array) substrate is provided. At least one semiconductor chip 40 is mounted on and electrically connected with the first substrate 41, and a plurality of supporting members 47 are glued to the first substrate 41 such that the supporting members 47 correspond in position to a periphery of the semiconductor chip 40, using an adhesive (not shown), for example. The semiconductor chip 40 is electrically connected to the first substrate 41 through a plurality of bonding wires 451. The supporting members 47 can be such as a scrap chip, a metal block, and an insulating block. The supporting members 47 are higher than a loop of the bonding wires 451.

Figure 5A:
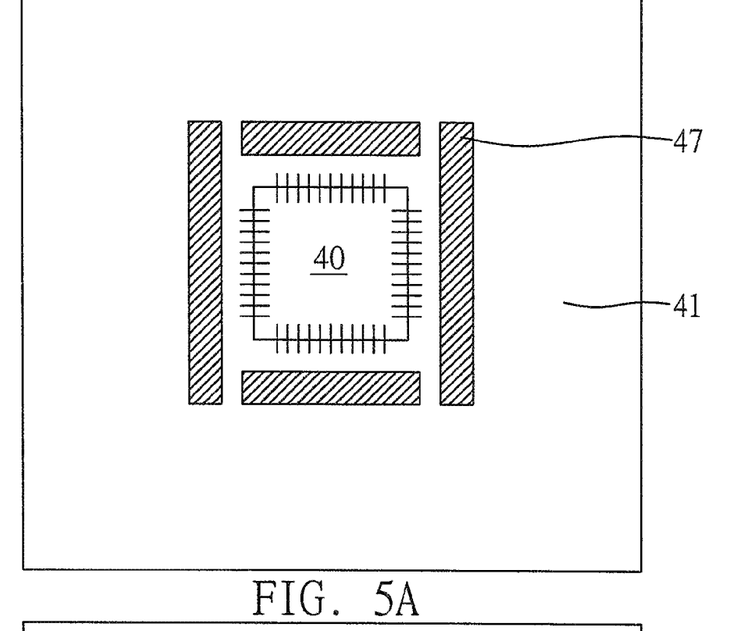
FIGS. 5A and 5B are plan views of a first substrate with a semiconductor chip and a plurality of supporting members mounted thereto according to the present invention.
Figure 5B:
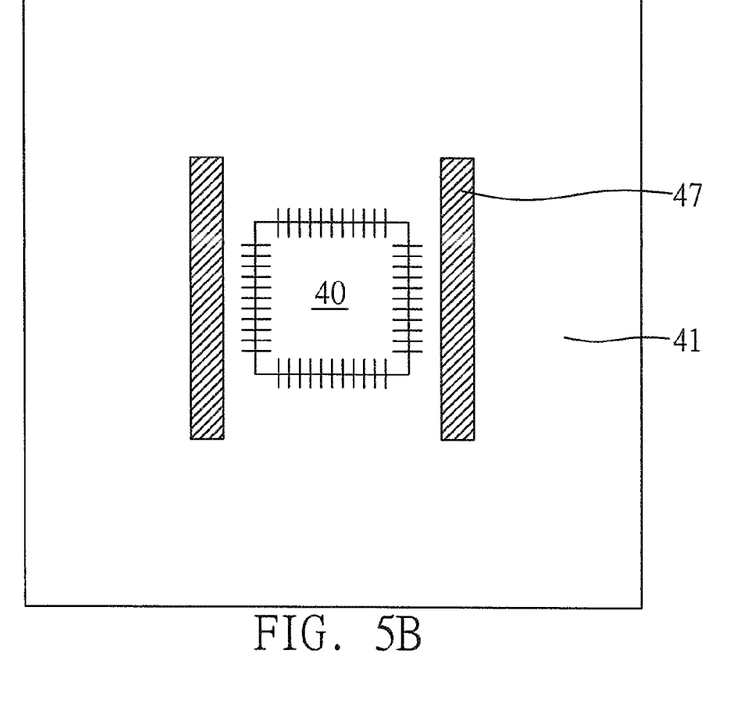

FIGS. 5A and 5B show a plan view of the first substrate 41 with the semiconductor chip 40 and the supporting members 47 mounted thereto. As shown in FIGS. 5A and 5B, the way of disposing the supporting members 47 on the first substrate 41 includes, but is not limited to, disposing the supporting members 47 on the four edges or two opposing edges of the semiconductor chip 40.

Figure 4B:
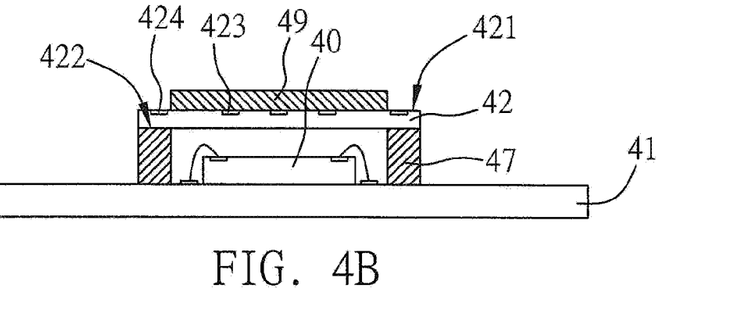

As shown in FIG. 4B, a second substrate 42 having a first surface 421 and a second surface 422 opposite to the first surface 421 is provided and held above the semiconductor chip 40 by being mounted to the supporting members 47 via the second surface 422 by an adhesive (not shown), and the first surface 421 of the second substrate 42 is partially covered by a tape 49.

Figure 6A:
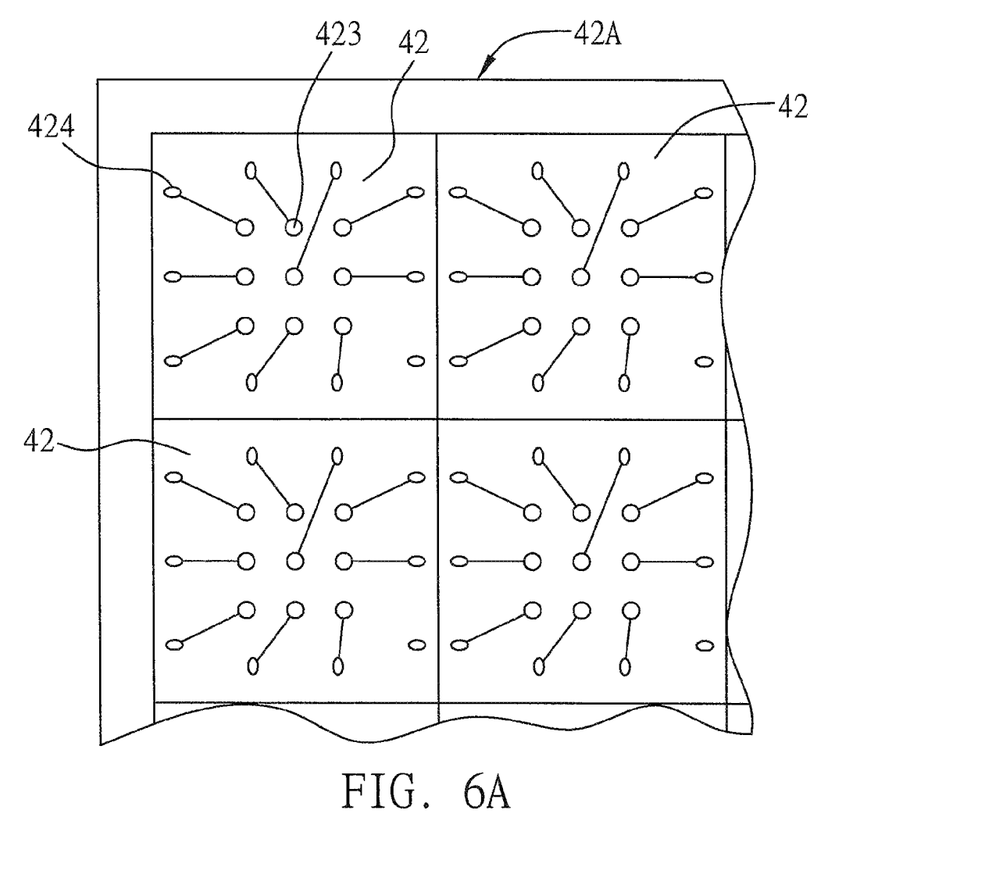
FIGS. 6A and 6B are schematic diagrams showing a fabrication method of a second substrate with a tape disposed thereon according to the present invention.
Figure 6B:
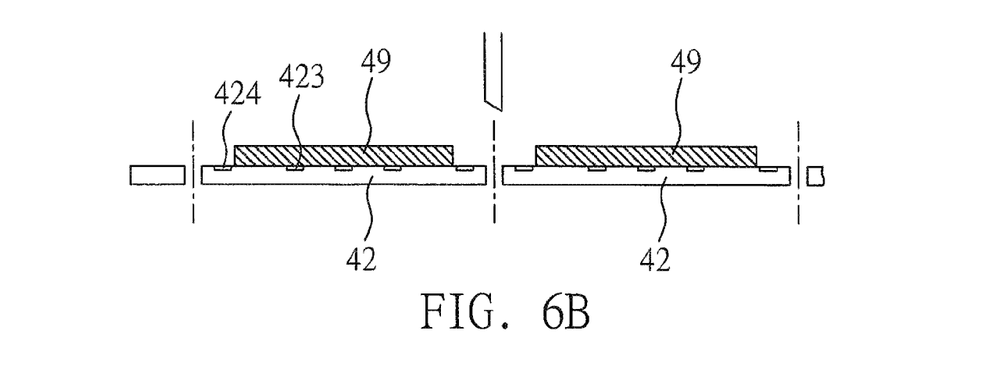

FIGS. 6A and 6B show a process for fabricating the second substrate 42. As shown in FIGS. 6A and 6B, a substrate module 42A having an array of second substrates 42 is provided first. The first surface of each of the second substrates 42 is centrally disposed with a plurality of solder pads 423 and peripherally disposed with a plurality of bonding pads 424. Further, a tape 49 is centrally disposed on the first surface of each of the second substrates 42 so as to cover the solder pads 423. Then, the substrate module 42A is cut along borders between the second substrates 42 so as to obtain a plurality of second substrates 42 each having the tape 49 disposed thereon. The second substrates 42 are then mounted on the supporting members 47.

Figure 4C:
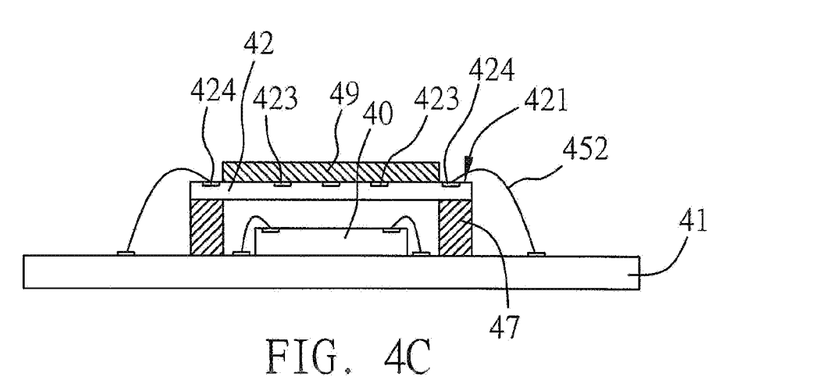

As shown in FIG. 4C, a wire bonding process is performed such that the bonding pads 424 of the second substrate 42 can be electrically connected to the first substrate 41 through bonding wires 452, wherein loop height of the bonding wires 452 is less than thickness of the tape 49.

Figure 4D:
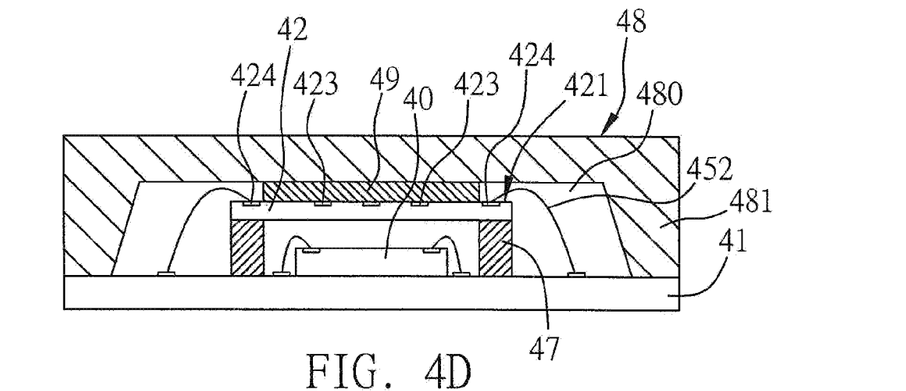

As shown in FIG. 4D, a conventional mold 48 having an upper mold 481 is provided. The upper mold 481 has a receiving space 480 formed at inner side thereof. The first substrate 41 with the second substrate 42 stacked thereon can be received in the receiving space 480 with the tape 49 disposed on the second substrate 42 abutting against the inner top side of the upper mold 481.

Figure 4E:
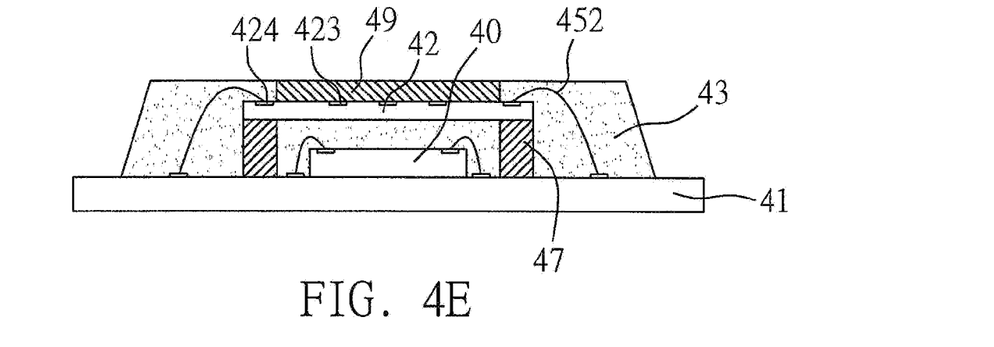

As shown in FIG. 4E, a molding process is performed such that an encapsulant 43 can be formed on the first substrate 41 so as to encapsulate the semiconductor chip 40, the second substrate 42, the bonding wires 452 and the tape 49. Thereafter, the mold is removed and the top of the tape 49 is exposed from the encapsulant 43.

Figure 4F:
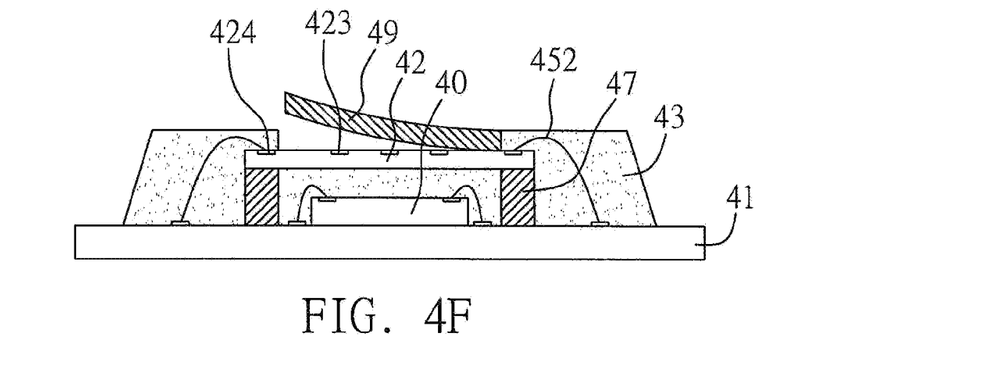

As shown in FIG. 4F, the tape 49 is removed by a mechanical means or by a chemical agent. Thus, the solder pads 423 centrally disposed on the first surface of the second substrate 42 are completely exposed such that a semiconductor chip or a semiconductor package can be mounted on the second substrate 42.

Figure 4G:
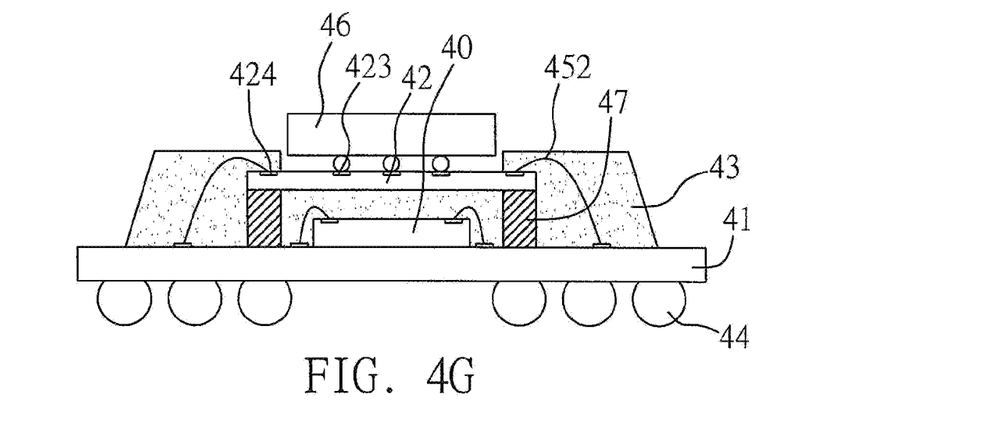

As shown in FIG. 4G, an electronic component 46, such as a semiconductor chip, a passive component and a semiconductor package, is mounted on the first surface of the second substrate 42 exposed from the encapsulant 43 and electrically connected to the solder pads 423 of the second substrate 42. Further, solder balls 44 are implanted on the bottom surface of the first substrate 41 for electrically connecting the semiconductor package to an external device.

In addition to the above fabrication method, the present invention discloses a stacked semiconductor structure. The disclosed stacked semiconductor structure comprises a first substrate 41, at least one semiconductor chip 40, a plurality of supporting members 47, a second substrate 42, a plurality of bonding wires 452, and an encapsulant 43. The semiconductor chip 40 is mounted and electrically connected to the first substrate 41. The supporting members 47 are glued to the first substrate 41 and correspond in position to a periphery of the semiconductor chip 40. The second substrate 42 comprises a first surface 421 and a second surface 422. The second substrate 42 is mounted to the supporting members 47 via the second surface 422. The bonding wires 452 electrically connect the first and second substrates 41 and 42. The encapsulant 43 is formed on the first substrate 41 to encapsulate the semiconductor chip 40, the bonding wires 452, the supporting members 47 and the second substrate 42. The first surface 421 of the second substrate 42 is partially exposed from the encapsulant 43. The stacked structure can further comprise at least one electronic component 46 mounted on the first surface 421 of the second substrate 42 exposed from the encapsulant 43.

According to the present invention, the solder pads on the first surface of the second substrate are completely exposed from the encapsulant, thereby eliminating the need of limiting the size and type of semiconductor packages stacked on the second substrate and the need of limiting the number of electrical I/O. Meanwhile, since the second substrate is electrically connected to the first substrate through bonding wires, the contamination of the semiconductor chip resulting from electrically connecting the second substrate to the first substrate through a reflow process in the prior art is prevented. Furthermore, the tape disposed on the second substrate can effectively avoid the use of special mold during the molding process in the prior art, thereby preventing the contamination problem of the second substrate resulting from encapsulant flash in the prior art. In consequence, it is feasible to fabricate a low-cost stacked semiconductor structure.

Second Embodiment

Figure 7:
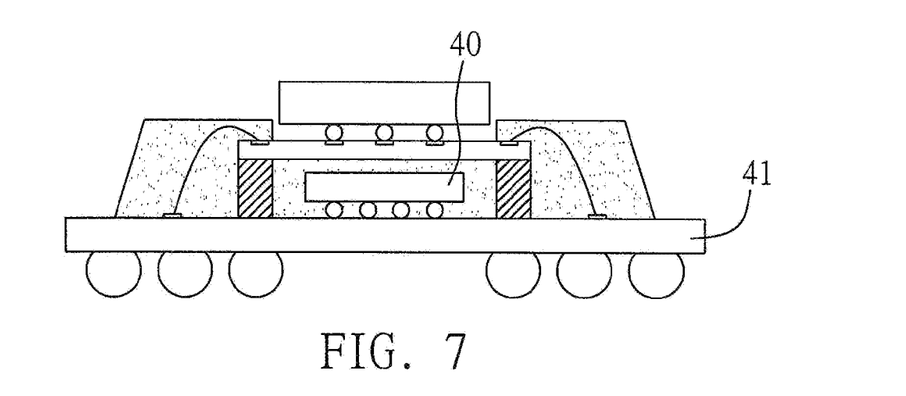
FIG. 7 is a cross-sectional view of a stacked semiconductor structure according to a second embodiment of the present invention.

FIG. 7 is a cross-sectional view of a stacked semiconductor structure according to the second embodiment of the present invention. The stacked semiconductor structure of the present embodiment is similar to that of the first embodiment. The main difference between the stacked semiconductor structure of the present embodiment and that of the first embodiment is that the semiconductor chip 40 is flip-chip mounted and electrically connected to the first substrate 41.

Third Embodiment

Figure 8:
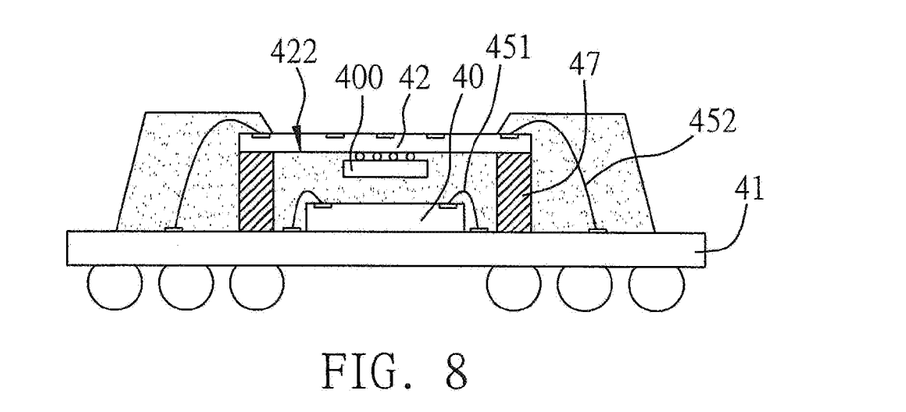
FIG. 8 is a cross-sectional view of a stacked semiconductor structure according to a third embodiment of the present invention.

FIG. 8 is a cross-sectional view of a stacked semiconductor structure according to the third embodiment of the present invention. The stacked semiconductor structure of the present embodiment is similar to that of the first embodiment. The main difference between the stacked semiconductor structure of the present embodiment and that of the first embodiment is that a semiconductor chip 400 is mounted to the second surface 422 of the second substrate 42 and is flip-chip electrically connected to the second substrate 42 before the second substrate 42 is mounted to the supporting members 47 for further electrical connection. Thereby, the electrical function of the stacked semiconductor structure can be enhanced.

Fourth Embodiment

Figure 9:
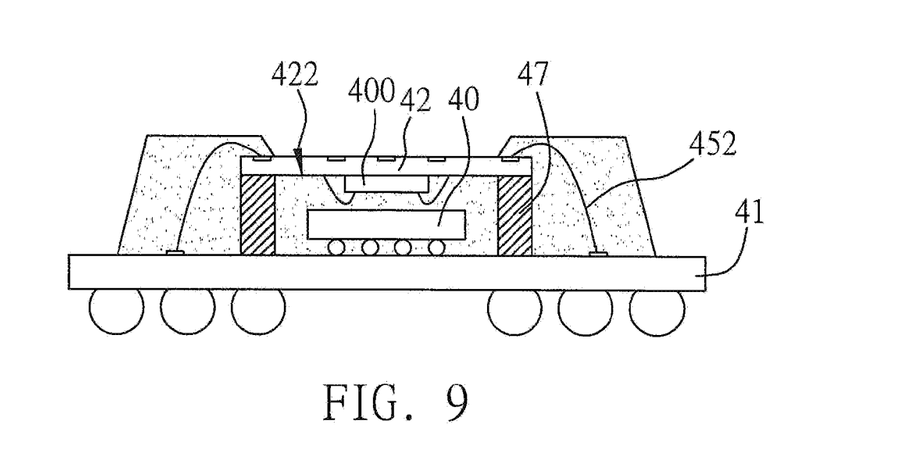
FIG. 9 is a cross-sectional view of a stacked semiconductor structure according to a fourth embodiment of the present invention.

FIG. 9 is a cross-sectional view of a stacked semiconductor structure according to the fourth embodiment of the present invention. The stacked semiconductor structure of the present embodiment is similar to that of the second embodiment. The main difference between the stacked semiconductor structure of the present embodiment and that of the second embodiment is that a semiconductor chip 400 is mounted to the second surface 422 of the second substrate 42 and electrically connected to the second substrate 400 through bonding wires before the second substrate 42 is mounted to the supporting members 47 for further electrically connection, thereby enhancing the electrical function of the stacked semiconductor structure.

Fifth Embodiment

Figure 10:
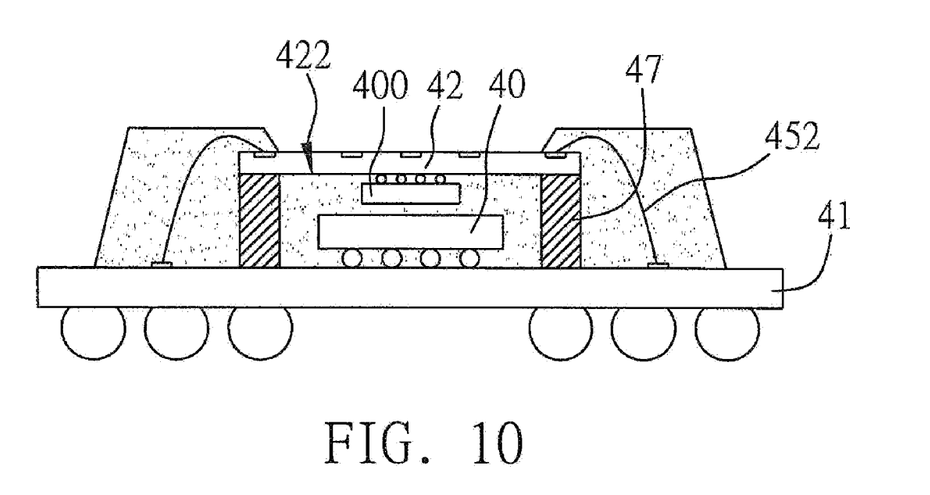
FIG. 10 is a cross-sectional view of a stacked semiconductor structure according to a fifth embodiment of the present invention.

FIG. 10 is a cross-sectional view of a stacked semiconductor structure according to the fifth embodiment of the present invention. The stacked semiconductor structure of the present embodiment is similar to that of the second embodiment. The main difference between the stacked semiconductor structure of the present embodiment and that of the second embodiment is that the semiconductor chip 400 is mounted to the second surface 422 of the second substrate 42 and flip-chip electrically connected to the second substrate 400 before the second substrate 42 is mounted to the supporting members 47 for further electrical connection, thereby enhancing the electrical function of the stacked semiconductor structure.

It should be noted that besides semiconductor chips, other elements such as passive components and semiconductor packages can be mounted to the second substrate.

Sixth Embodiment

Figure 11A:
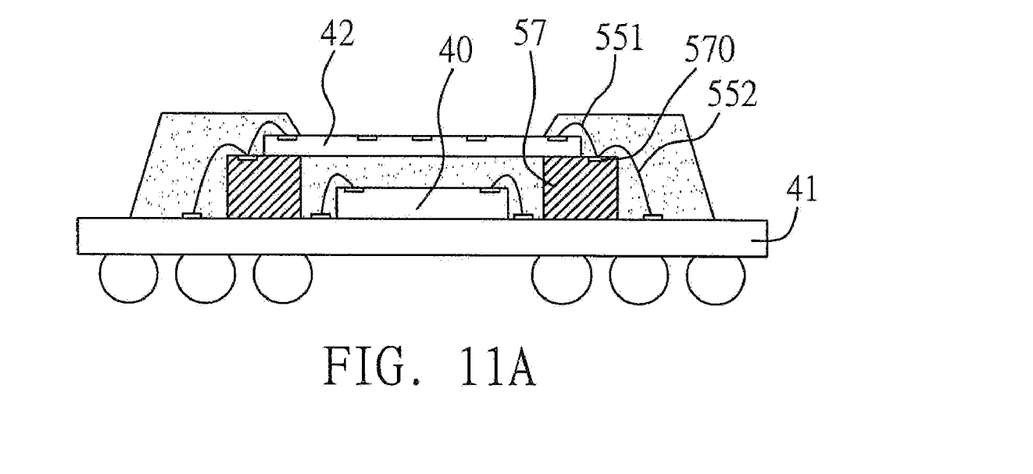
FIGS. 11A and 11B are cross-sectional views of a stacked semiconductor structure according to a sixth embodiment of the present invention.
Figure 11B:
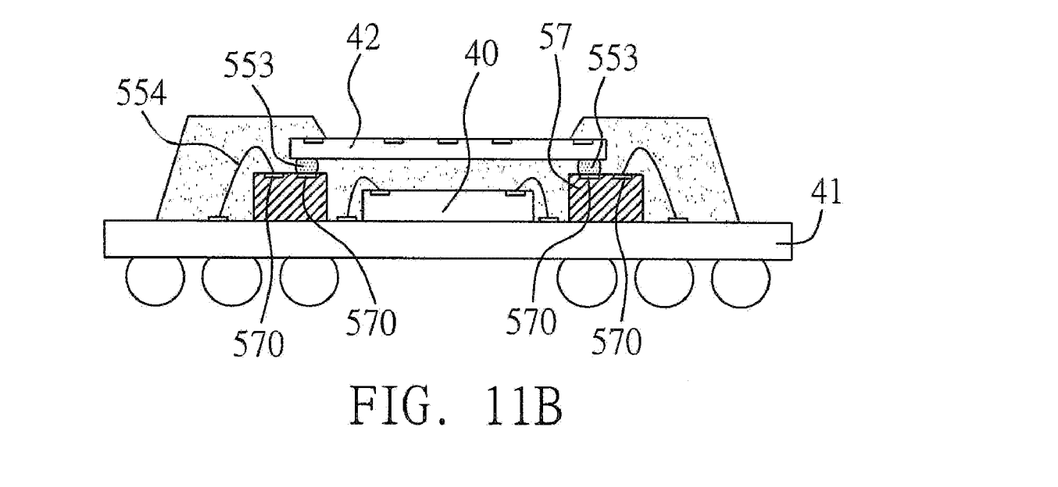

FIGS. 11A and 11B are cross-sectional views of a stacked semiconductor package according to the sixth embodiment of the present invention. The stacked semiconductor structure of the present embodiment is similar to that of the first embodiment. The main difference between the stacked semiconductor structure of the present embodiment and that of the first embodiment is that the supporting members disposed around the semiconductor chip 40 are replaced with substrate pieces 57 such that the second substrate 42 is electrically connected to the substrate pieces 57 and is further electrically connected to the first substrate 51 via the substrate pieces 57, thereby reducing the length of the bonding wires electrically connecting the first substrate 41 and the second substrate 42.

As shown in FIG. 11A, a plurality of electrical connection pads 570 are disposed on the substrate pieces 57. After the second substrate 42 is mounted to the supporting members like the substrate pieces 57, the second substrate 42 and the electrical connection pads 570 of the substrate pieces 57 are electrically connected by first bonding wires 551, and the electrical connection pads 570 of the substrate pieces 57 and the first substrate 41 are electrically connected by the second bonding wires 552.

As shown in FIG. 11B, the second substrate 42 can also be mounted and electrically connected to the electrical connection pads 570 of the substrate pieces 57 through conductive bumps 553. The electrical connection pads 570 of the substrate pieces 57 are further electrically connected to the first substrate 41 through bonding wires 554.

Seventh Embodiment

FIGS. 12A to 12D are cross-sectional views showing a stacked semiconductor structure and fabrication method thereof according to the seventh embodiment of the present invention. The stacked semiconductor structure of the present embodiment is similar to that of the first embodiment. The main difference between the stacked semiconductor structure of the present embodiment and that of the first embodiment is that the stacked semiconductor structure in the present embodiment is fabricated by batch production so as to increase the fabrication speed and decrease the fabrication cost.

Figure 12A:
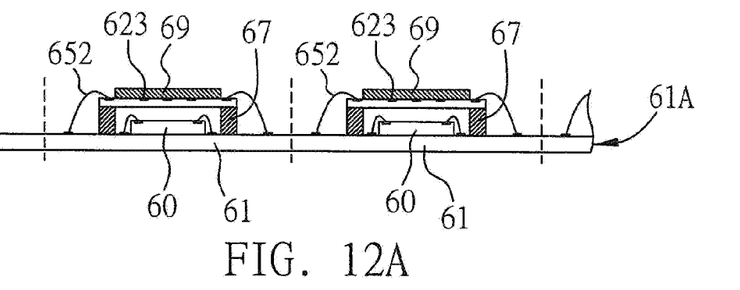
FIGS. 12A through 12D are cross-sectional views showing a stacked semiconductor structure and fabrication method thereof according to a seventh embodiment of the present invention.

As shown in FIG. 12A, a first substrate module 61A having a plurality of stacked substrate structures is provided, wherein each of the stacked substrate structures has a first substrate 61, and a semiconductor chip 60 is mounted on and electrically connected to the first substrate 61. A plurality of supporting members 67 corresponding in position to a periphery of the semiconductor chip 60 are glued to the first substrate 61. A second substrate 62 is mounted to the supporting members 67 and electrically connected to the first substrate 61 through bonding wires 652. The second substrate 62 has a tape 69 disposed thereon. The tape 69 covers solder pads 623 formed on the second substrate 62.

Figure 12B:
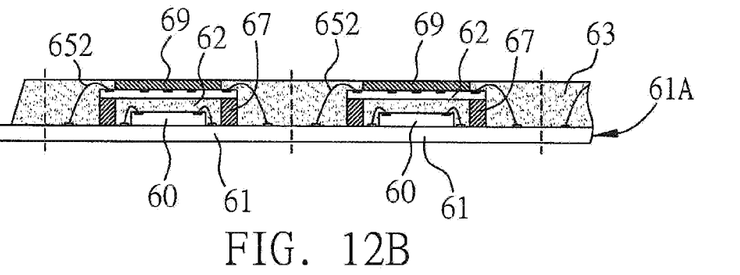

As shown in FIG. 12B, a molding process is performed such that an encapsulant 63 can be formed on the first substrate module 61A to encapsulate the semiconductor chips 60, the supporting members 67, the second substrates 62, the bonding wires 652 and the tapes 69. The top side of each of the tapes 69 is exposed from the encapsulant.

Figure 12C:
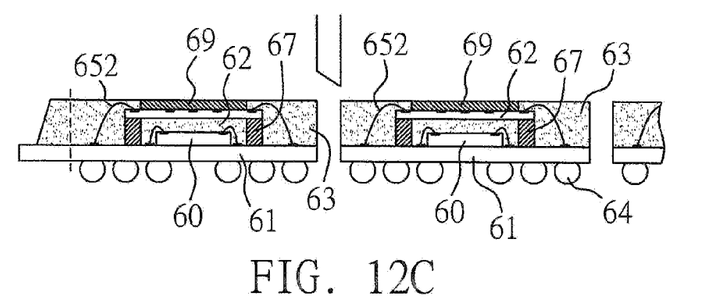

As shown in FIG. 12C, a plurality of solder balls 64 are implanted on the bottom surface of each of the first substrates 61. The first substrate module 61A is further cut along borders between the first substrates 61 so as to form a plurality of stacked semiconductor structures.

Figure 12D:
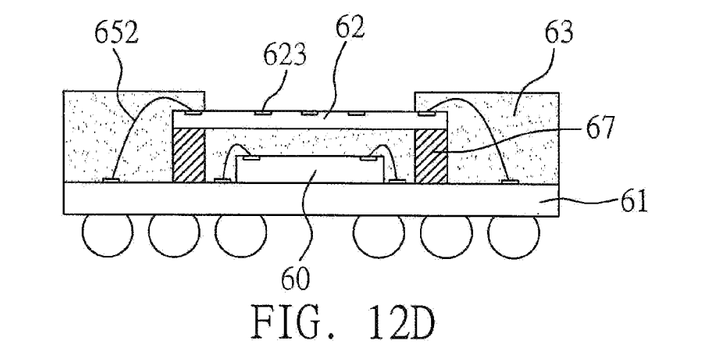

As shown in FIG. 12D, the tape 69 is removed to completely expose the solder pads 623 on the second substrate 62 such that semiconductor chips, semiconductor packages or passive components can be mounted on and electrically connected with the second substrate through the exposed solder pads 623.

The above-described exemplary embodiments are to describe various principles and features of the present invention and are intended to be illustrative rather than restrictive. A person ordinarily skilled in the art would recognize that modifications and changes could be made in forms and details without departing from the spirit and the scope of the invention. Thus, the right protective scope of the present invention should fall within the appended claim.

The invention claimed is:

1. A method of fabricating a stacked semiconductor structure, comprising the steps of:
   mounting and electrically connecting at least one semiconductor chip to a first substrate, disposing on the first substrate a plurality of supporting members corresponding in position to a periphery of the semiconductor chip;
   mounting a second substrate having a first surface and a second surface opposite to the first surface to the supporting members via the second surface, wherein a portion of the first surface is covered by a tape;
   connecting electrically the first and second substrates through bonding wires, wherein the first substrate having the second substrate stacked thereon is mounted inside a mold having an upper mold, with an inner top side of the upper mold abutting against the tape disposed on the second substrate; and
   performing a molding process to form on the first substrate an encapsulant that encapsulates the semiconductor chip, the supporting members, the second substrate, and the bonding wires, wherein a top surface of the tape is exposed and not covered by the encapsulant.

2. The method of claim 1, further comprising:
   removing the tape so as to expose a portion of the first surface of the second substrate out of the encapsulant; and
   mounting and electrically connecting an electronic component to the first surface of the second substrate where the first surface is exposed.

3. The method of claim 1, wherein the semiconductor chip is electrically connected to the first substrate by one of a wire bonding process and a flip chip process.

4. The method of claim 1, wherein each of the supporting members is one selected from the group consisting of a scrap chip, a metal block and an insulating block.

5. The method of claim 1, wherein each of the supporting members is a substrate piece for electrically connecting the second substrate and the first substrate.

6. The method of claim 1, wherein the second substrate is fabricated by a method comprising the steps of:
   providing a substrate module having an array of second substrates, disposing centrally a plurality of solder pads on the first surface of each of the second substrates, disposing peripherally a plurality of bonding pads on the first surface of each of the second substrates, disposing centrally the tape on each of the second substrates that covers the solder pads; and
   cutting the substrate module along borders between the second substrates, thus forming a plurality of second substrates each having the tape disposed thereon.

7. The method of claim 6, wherein the bonding pads electrically connect the second substrate and the first substrate through the bonding wires.

8. The method of claim 6, wherein the tape is removed to expose the solder pads and thereby electrically connect an electronic component to the solder pads that are exposed.

9. The method of claim 1, wherein the second surface of the second substrate is mounted and electrically connected with one selected from the group consisting of another semiconductor chip, a passive component, and a semiconductor package.

10. The method of claim 9, wherein the semiconductor chip is electrically connected to the second substrate by one of a wire bonding process and a flip chip process.

11. The method of claim 1, wherein the tape has a thickness such that its top surface is above a top surface of a loop of the bonding wires.

12. The method of claim 1, wherein the first substrate comprises a bottom surface with solder balls thereon.

13. The method of claim 1, wherein the stacked semiconductor structure is fabricated by one of one-off production and batch production.

14. The method of claim 13, wherein the stacked semiconductor structure is fabricated by batch production comprising the steps of:

providing a first substrate module comprising first substrates, mounting and connecting electrically each of the first substrates with a first semiconductor chip, gluing to each of the first substrates the plurality of supporting members corresponding in position to a periphery of the first semiconductor chip, mounting each of a plurality of second substrates on the supporting members, forming a first tape on each of the plurality of second substrates, wherein the first tape covers solder pads formed on the plurality of second substrates, connecting electrically the second substrate and the first substrate by the bonding wires;

performing the molding process to form on the first substrate module the encapsulant for encapsulating the first semiconductor chip, the supporting members, the plurality of second substrates, the bonding wires and the tape, wherein a top surface of the tape is exposed and not covered by the encapsulant;

forming solder balls on a bottom surface of each of the first substrates, cutting the first substrate module along borders between the first substrates so as to separate the first substrates from each other; and removing the tape to completely expose the solder pads on the plurality of second substrates.

\* \* \* \* \*